United States Patent [19]
Hasegawa

[11] Patent Number: 5,982,184
[45] Date of Patent: Nov. 9, 1999

[54] TEST HEAD FOR INTEGRATED CIRCUITS

[75] Inventor: Yoshiei Hasegawa, Kanagawa-ken, Japan

[73] Assignee: Kabushiki Kaisha Nihon Micronics

[21] Appl. No.: 08/921,780

[22] Filed: Sep. 2, 1997

[30] Foreign Application Priority Data

Dec. 19, 1996 [JP] Japan .................................. 8-353897

[51] Int. Cl.⁶ .................................................. G01R 31/02
[52] U.S. Cl. ........................... 324/754; 324/757; 324/758
[58] Field of Search ................................. 324/754, 158.1, 324/765, 758, 757

[56] References Cited

FOREIGN PATENT DOCUMENTS

| | | |
|---|---|---|
| 1-201166 | 8/1989 | Japan . |
| 4-83356 | 3/1992 | Japan . |
| 4-186855 | 7/1992 | Japan . |
| 4-330748 | 11/1992 | Japan . |
| 07201935 | 8/1995 | Japan . |

*Primary Examiner*—Josie Ballato
*Assistant Examiner*—T. R. Sundaram
*Attorney, Agent, or Firm*—Christensen, O'Connor, Johnson & Kindness PLLC

[57] ABSTRACT

A test head is used in an electrical characteristic test of a plurality of integrated circuits formed on a semiconductor wafer. The test head includes a probe holder in a frame form for holding a plurality of first probes and supporting bodies in a plate form for supporting a plurality of second probes. The probe holder is disposed on a base plate such that the first probes are brought into contact with pads disposed at a portion corresponding to the edge portion defining an opening formed in the base plate. The supporting bodies are attached to the base plate with the direction of their thickness oriented in the lengthwise direction of the opening in the base plate in order that the second probes are brought into contact with pads existing at the boundary portions of a plurality of integrated circuits to be tested at a time and disposed at the portions corresponding to the adjoining sides of the integrated circuits.

6 Claims, 6 Drawing Sheets

TEST HEAD FOR INTEGRATED CIRCUITS

BACKGROUND OF THE INVENTION

1. Field of the Invention

The present invention relates to a test head for use in an electrical characteristic test of a plurality of integrated circuits formed on a semiconductor wafer.

2. Description of the Prior Art

Generally, as shown in FIGS. 7 and 8, a plurality of integrated circuits 12 are formed on a semiconductor wafer 10 in a matrix array. Each of the integrated circuits has a square form and has a plurality of electrode portions, i.e., electrode pads 14, formed on each edge portion corresponding to each side of the square. The integrated circuits 12 constituting each row and each column of the matrix are in a straight line.

Such integrated circuits are subjected to electricity-loaded tests (electrical characteristic tests) as to whether the circuits function as designated in specifications. Such tests are generally carried out using a testing head, i.e., a test head, generally called a probe card, probe board, or the like.

If units of the integrated circuits are tested unit by unit in such an electricity-loaded test, it takes a long time to carry out the test on all of the integrated circuits formed on one wafer. Therefore, it is desired that a plurality of integrated circuits are tested at the same time in such electricity-loaded tests.

In the gazette of Japanese Patent Apple. Public Disclosure No. 1-201166, there are disclosed two types of test heads for testing (inspecting) at the same time a plurality of integrated circuits successively arranged in alignment with the row or column of a matrix array. One type of the heads is provided with a plurality of probes disposed on a plate-like member with a rectangular opening formed in its center. The other type of the heads is provided with a plurality of probes disposed on two plate-like members, each having a rectangular opening formed in the center, in which both the plate-like members are piled up such that probes of both of the plate-like members cross each other.

In the one type of the heads, the probes disposed at the edge portions of the opening in the lengthwise direction are put in contact with pads in the direction of the array of integrated circuits to be tested and the probes disposed at the edge portions of the opening in the widthwise direction are put into contact with pads in the direction perpendicular to the direction of the array of the integrated circuits. In such a head, since a great number of probes for a plurality of integrated circuits must be disposed at the edge portions of the opening in the lengthwise direction, probes to be disposed at the edge portion of the opening in the lengthwise direction becomes too many. As a result, it is difficult to correctly connect the probes to their respective wiring portions and, hence, wrong connection between the probe and the wiring portion is frequently made.

In the case of the other type of the heads, the probes disposed on one plate-like member at the edge portions of its opening in the lengthwise direction are put into contact with pads arranged in the direction of the array of integrated circuits to be tested and the probes disposed on the other plate-like member at the edge portions of its opening in the lengthwise direction are put into contact with pads arranged in the direction perpendicular to the array of the integrated circuits. In such a head, however, since the probes of both the plate-like members cross each other, it is difficult to dispose the probes on the plate-like members without causing the probes of both the plate-like members to contact each other and to assemble both the plate-like members into a unit.

An object of the present invention is to prevent the probes from contacting each other and facilitate the connection work of the probes to the wiring portions and the fabrication of the heads.

SUMMARY OF THE INVENTION

The test head according to the invention comprises a base plate having a rectangular opening formed in its center, a probe holder having a first probe supporting portion extended along the edge portion of the opening and attached to the base plate, one or more plate-like supporting bodies having a second probe supporting portion extended in the widthwise direction of the opening, a plurality of first probes disposed at the first probe supporting portion, and a plurality of second probes disposed at the second probe supporting portion, in which the supporting body is attached to the base plate with the direction of its thickness oriented in the lengthwise direction of the opening.

There are provided supporting bodies proportional in number to the number of integrated circuits to be tested at a time. Hence, when a plurality of supporting bodies are provided, the supporting bodies are attached to the base plate spaced apart in the lengthwise direction of the opening. The first probes are brought into contact with first pads disposed at the portion corresponding to the edge portion defining the opening of the base plate. The second probes are brought into contact with second pads disposed at the portions corresponding to the adjoining sides of the integrated circuits and existing at the boundaries between the plurality of integrated circuits to be tested at a time.

The test head can be fabricated by, first, attaching separately the first and second probes to the probe holder and the supporting bodies respectively and, then, attaching the supporting bodies to the base plate. Thus, fabrication of the heads is facilitated. Since the integrated circuits to be tested at a time are successively disposed in the lengthwise direction of the opening of the base plate, the first probes may be connected to common wiring means or they may be divided into groups in the lengthwise direction of the opening and each group may be connected to the same wiring means. The second probes, when they are arranged in one layer, can be connected to the same wiring means and, when they are arranged in multiple layers, those for each layer can be connected to the same wiring means. Therefore, wiring work is facilitated, and there is no fear of incorrect wiring to be made.

According to the invention, a plurality of supporting bodies with probes disposed thereon are disposed on the base plate such that the direction of their thickness are oriented in the lengthwise direction of the opening and the second probes are adapted to be brought into contact with pads existing at the boundaries between a plurality of integrated circuits to be tested at a time and disposed at the portions corresponding to the adjoining sides of the integrated circuits. Therefore, it is not necessary to make the probes cross each other, and there is no fear of the probes contacting each other. In addition, connection work of the probes to the wiring portions and fabrication of the head is facilitated.

The second probes can be divided into groups different in their probe tip positions in the lengthwise direction of the opening. Thereby, wiring means can be provided for each group of the probes.

The second probe can be formed of the probe base portion held by the probe supporting portion, the probe tip portion extending in the direction to the side opposite to the base plate from the front end of the probe base portion, and a probe tail portion extending in the direction opposite to the probe tip portion from the rear end of the probe base portion. By arranging as described above, wiring means can be disposed perpendicularly to the base plate and, hence, operation to confirm the relative position between the pads and the probe tips is not impeded by the wiring means.

In a preferred embodiment, the head further comprises wiring means for the second probes including one or more flexible, belt-like cables and a plurality of conductive, cylindrical connection members, in which the cable includes a plurality of first conductor portions extended parallel to each other, first insulator layers covering the periphery of the respective first conductor portions, second conductor portions covering the periphery of the respective first insulator layers, and a second insulator layer covering the second conductor members so as to integrally couple the second conductor members together, and each connection member has its one end portion fitted on the probe tail portion of the second probe and its other end portion fitted on the first conductor portion. By the described configuration, the probe and the first conductor portion can be connected more easily and certainly than in the case where an ordinary flat cable is used and, in addition, noises mixing into the first conductor portion can be prevented by the second conductor portion.

The second probes can be arranged in multiple layers and the layers can be connected to their respective wiring means. In this case, each wiring means can be formed of one or more flexible and belt-like cables and a plurality of conductive and cylindrical connection members for the second probes, in which the cable can be comprised of a plurality of first conductor portions extended parallel to each other, first insulator layers covering the periphery of the respective first conductor portions, second conductor portions covering the periphery of the respective first insulator layers, and a second insulator layer covering the second conductor members so as to integrally couple the second conductor members together, and the connection member can have its one end portion fitted on the probe tail portion of the second probe and its other end portion fitted on the first conductor portion.

Further, the head can have one or more sheet-like members disposed between adjoining probe groups and connected to the second conductor portion. With such an arrangement made, leakage of signals between the adjoining probe groups can be prevented by the sheet-like members.

The sheet-like member can have a conductor layer connected to the second conductor layer and insulator layers formed on both sides of the conductor layer. The probes can be attached to the probe supporting portion by means of an adhesive agent. Further, the sheet-like member can have a plurality of holes which allow the adhesive agent to pass through.

DETAILED DESCRIPTION OF THE PREFERRED EMBODIMENTS

Figure 7:
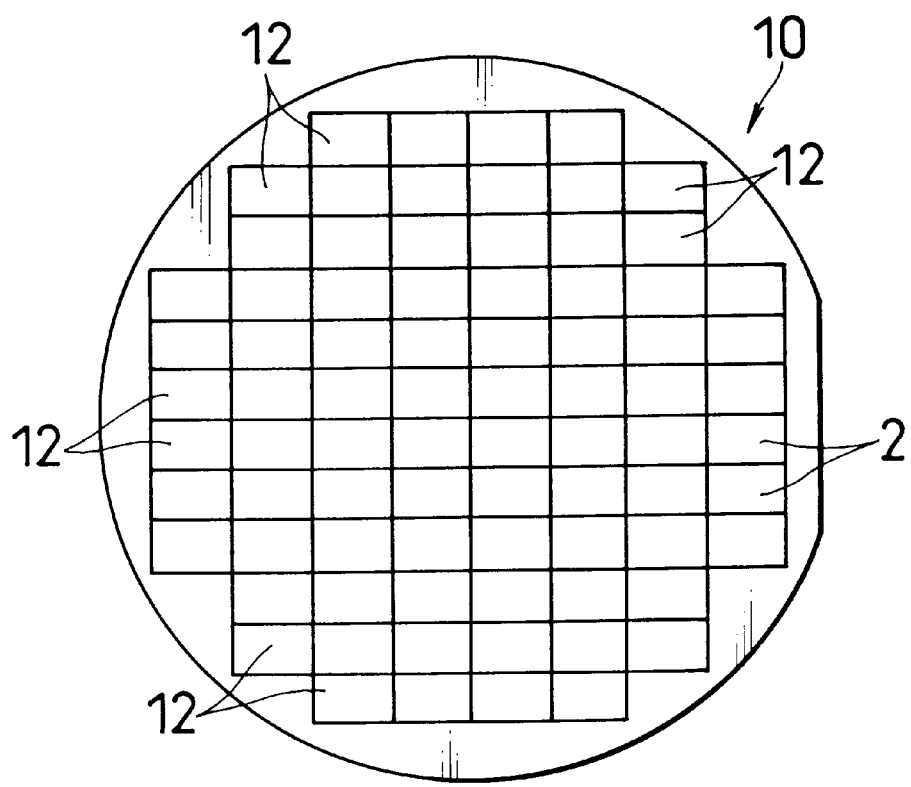
FIG. 7 is a diagram showing an embodiment of a semiconductor wafer to be tested.
Figure 8:
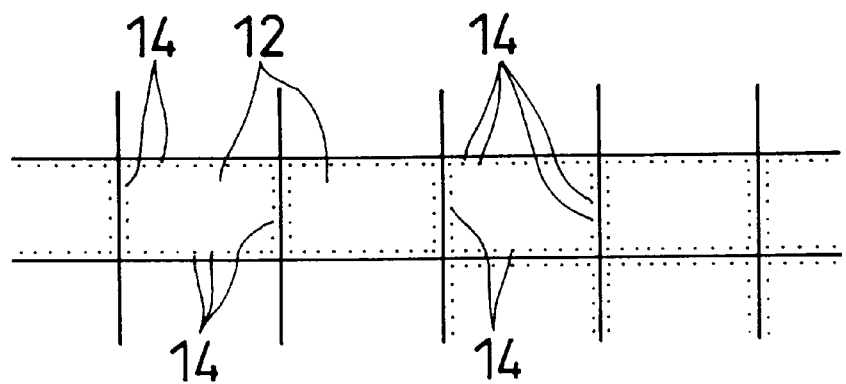
FIG. 8 is a diagram showing an embodiment of chip portions of integrated circuits formed on a semiconductor wafer.

Referring to FIGS. 1 to 5, a test head 20 is an inspection head called a probe card, probe board, or the like, and it is used for an electrical characteristic test of a plurality of integrated circuits (four integrated circuits in the case shown) successively arranged in line of all the rectangular integrated circuits 12 formed on the wafer 10 as shown in FIGS. 7 and 8. Each unit of the integrated circuits 12 has a square shape and has a plurality of electrodes, i.e., pads 14, at each edge portion corresponding to each side of the square. The integrated circuits 12 constituting each row and each column of the matrix are in a straight line.

The test head 20 comprises a disk-like base plate 22, a probe holder 24 attached to the base plate 22, a plurality of (three in the case shown) supporting bodies 26 in a flat plate form arranged spaced apart and parallel to each other on the base plate 22, a plurality of first probes 28 held by the probe holder 24 in a cantilever-like manner, a plurality of second probes 30 held by the supporting plates 26 in a cantilever-like manner, and a plurality of flexible cables 32.

The base plate 22 may be made of an electrically insulating material such as ceramic and synthetic resin. The base plate 22 has an opening 34 in the center through which a device under test can be visually observed, and, further, has, on the circumference of the opening 34, a step portion, i.e., a cut portion 36, which faces downward and receives the probe holder 24.

The opening 34 and cut portion 36 have a rectangular shape similar to the planar shape of the array of a plurality of integrated circuits to be tested at a time. The opening 34 is a through hole passing through the base plate 22 in the direction of its thickness. The cut portion 36 is formed on the bottom face of the base plate 22 and on the inner wall face defining the opening 34 and has virtually the same size as the probe holder 24.

The base plate 22 is a wiring board having, on both its top and bottom faces, pluralities of wirings (not shown) extended in the radial directions around the cut portion 36 and spaced apart in the circumferential direction. Each of the wirings is a portion of a wiring pattern formed on the base plate 22 by means of a printed-wiring technology. However, pluralities of wirings may be formed on the base plate 22 by attaching film-like members having a wiring pattern formed thereon to both top and bottom faces of a base plate using an adhesive agent or the like. The wirings disposed on the top face and the bottom face are electrically connected with each other.

The base plate 22 has, at the circumferential portion of its top face, a plurality of terminal portions, i.e., lands 38, connected to electric circuits for power supply and signal processing. It also has a plurality of connectors 40 disposed at intermediate portions of the top face for connecting cables 32 thereto. Each land 38 is connected with the wiring of the base plate 22. Each connector 40 is formed of a plurality of terminal portions and each terminal portion is connected to the land 38 by the wiring on the base plate 22.

The base plate 22 may be provided in a multilayer structure having one or two or more of wiring patterns, which are formed on electrically insulating film-like sheet materials by means of a printed-wiring technology, disposed in the middle in the direction of the thickness. Although the lands 38 are arranged in a single layer in the case shown, they may be arranged in multiple layers according to the numbers of the probes 28 and 30 and the wirings.

The probe holder 24 is made of an electrically insulating material such as ceramic in a rectangular frame form similar to the opening 34 and holds a plurality of the first probes 28 at each of the portions corresponding to the sides of the rectangle. The opening formed inside the probe holder 24 has a rectangular shape virtually of the same size as the opening 34 in the base plate 22. The bottom portion (especially, the bottom face) of the probe holder 24 constitutes a probe supporting portion for attaching the first probes 28 in place. The bottom portion is extended along the edge portion defining the opening 34 and projects downward from the bottom face of the base plate 22.

The probe holder 24, in the case shown, is attached to the cut portion 36 of the base plate 22 with an adhesive agent. However, the probe holder 24 may be removably attached to the base plate 22 by a plurality of screw members. Further, the probe holder 24, instead of being directly attached to the base plate 22, may be indirectly attached to the base plate 22 through suitable means such as a reinforcement plate and an attaching plate. Still further, a portion of the base plate 22 may be utilized as the probe holder 24.

Each of the supporting body 26 is made of an electrically insulating material such as ceramic and has a rectangular probe base portion and attaching portions projecting into opposite directions from both sides of the upper portion of the probe base portion. The supporting bodies 26 are disposed spaced apart in the lengthwise direction of the opening 34 and positioned perpendicularly to the base plate 22 and parallel to each other. In the case shown, each supporting body 26 is removably attached at its attaching portions to the base plate 22 with screw members 42 such that the direction of its thickness is oriented in the lengthwise direction of the opening 34. However, the supporting body 26 may be adhesively attached to the base plate 22.

Figure 1:
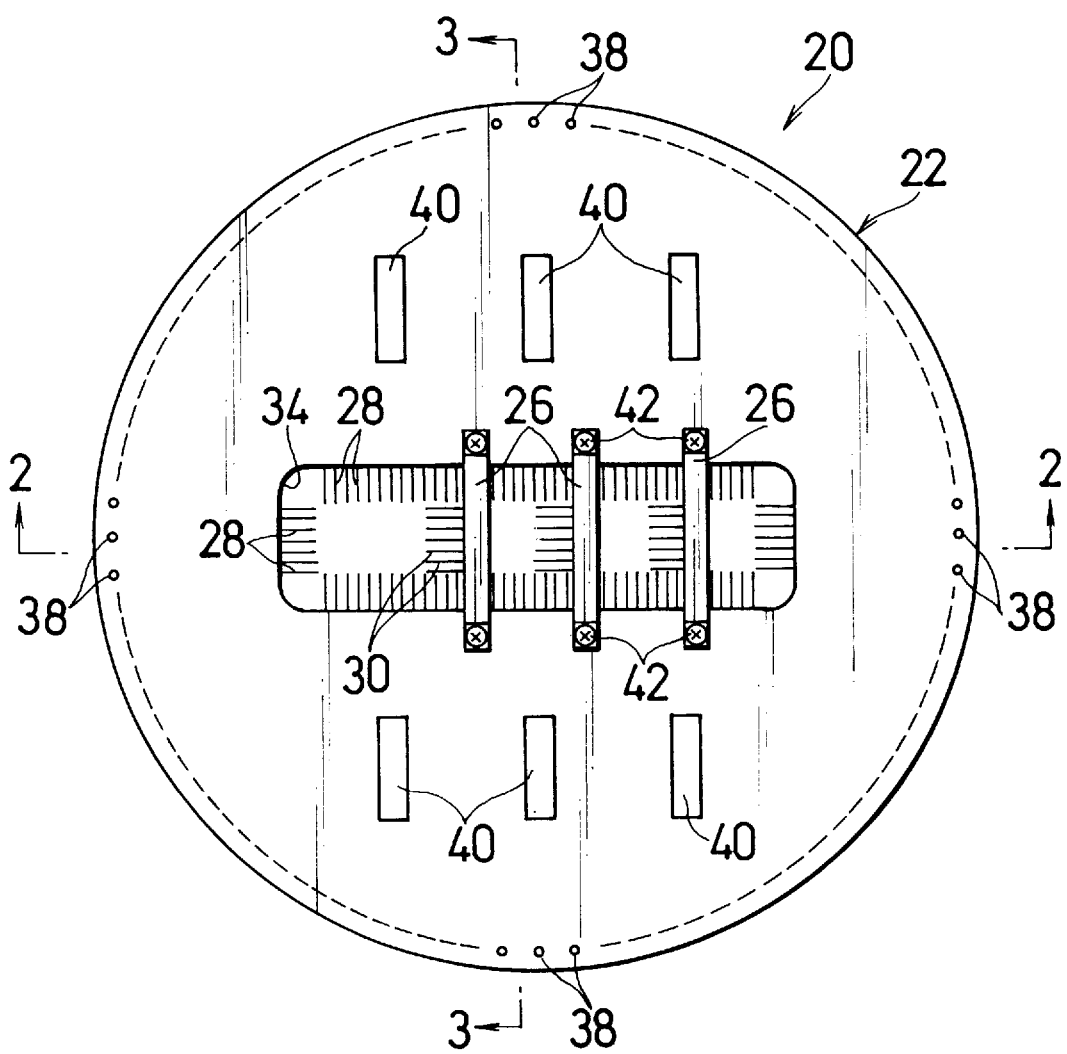
FIG. 1 is a plan view showing an embodiment of a test head of the invention with cables removed.
Figure 2:
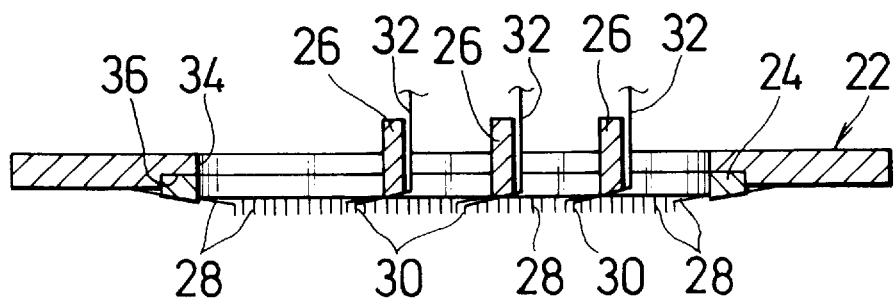
FIG. 2 is a sectional view taken along line 2—2 of FIG. 1.
Figure 3:
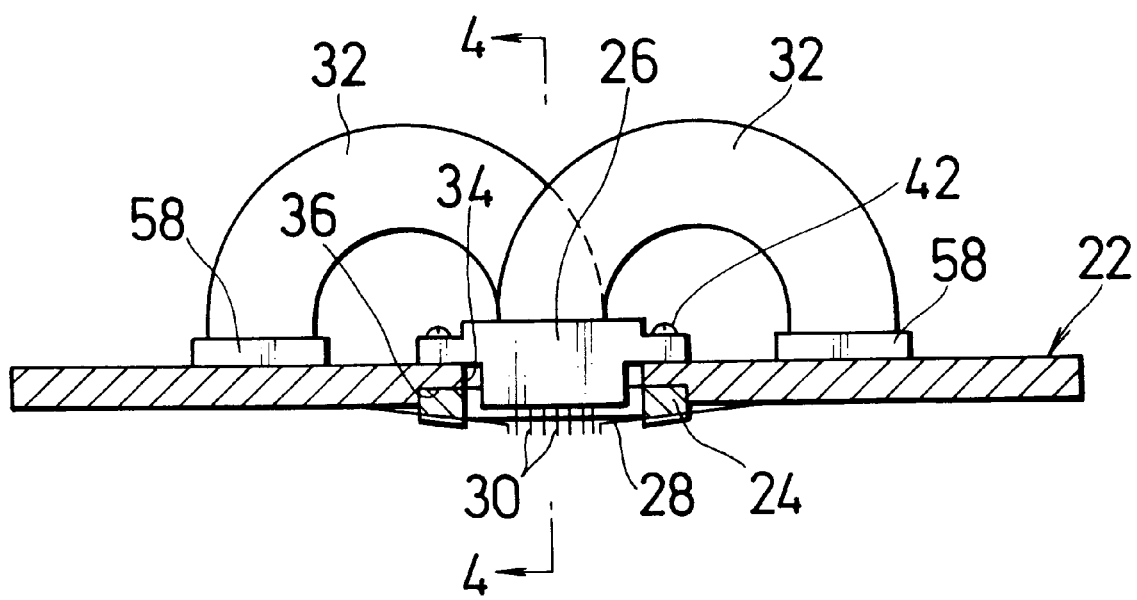
FIG. 3 is a sectional view taken along line 3—3 of FIG. 1.
Figures 4A, 4B:
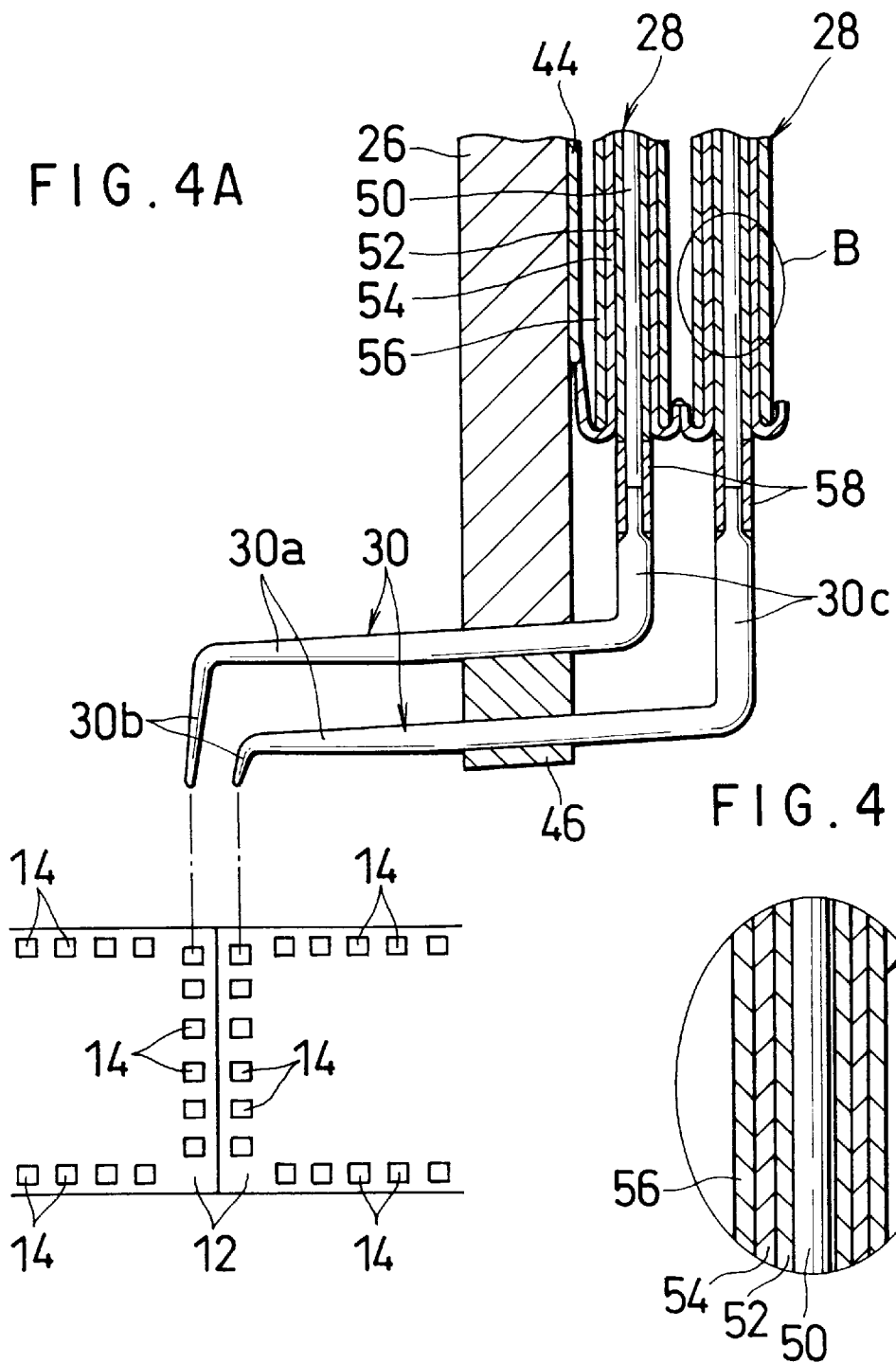
FIG. 4(A) is an enlarged sectional view of a supporting body, second probes, and cables taken along line 4—4 of FIG. 3.
FIG. 4(B) is an enlarged sectional view of the portion B in FIG. 4(A)

The bottom portion (especially, the bottom face) of the supporting body 26 is positioned within the opening 34 and constitutes a thin probe supporting portion to attach the second probes 30 in place. As shown in FIG. 4, each supporting body 26 has on its one face a conductor layer 44 to be grounded.

Each of the first probes 28 is formed of a conductive, metallic thin wire with a circular cross section. Each of the first probes 28 comprises a probe base portion with an even diameter, a probe tip portion extended from the front end of the probe base portion and bent from the probe base portion to the side opposite to the base plate 22 (i.e., bent downward), and a probe tail portion extended from the rear end of the probe base portion and bent from the probe base portion to the side of the base plate 22. The portion extended from the front end side of the probe base portion to the probe tip is made to become gradually thinner toward the tip end, i.e., it is tapered off.

The first probes 28, at the portion corresponding to each side of the rectangle defined by the probe holder 24 and the opening 34, are arranged spaced apart in the direction of the corresponding side and extended in the direction of the width of the probe holder 24. The probe base portions of the same are attached to the underside of the probe holder 24 by suitable means such as an electrically insulating adhesive agent. The probe tips of the first probes 28 disposed at the portion corresponding to the same side of the rectangle are positioned on a common imaginary line. The probe tail portion of each first probe 28 is connected to the wiring formed on the base plate 22 by suitable means such as soldering.

The second probe 30, as shown in FIG. 4, is formed of a conductive, metallic thin wire with a circular cross section, and comprises a probe base portion 30a having a uniform diameter, a probe tip portion 30b extended from the front end side of the probe base portion 30a and bent from the probe base portion 30a to the side opposite to the base plate 22 (bent downward), and a probe tail portion 30c continuing to the rear side of the probe base portion and bent to the side opposite to the probe tip portion 30b (bent upward). The portion extended from the front end side of the probe base portion 30a to the probe tip is made to become gradually thinner toward the tip end, i.e., it is tapered off. The rear end portion of the probe tail portion 30c of the second probe 30 is formed smaller in diameter.

The second probes 30 are disposed on the bottom face portion of the supporting body 26 spaced apart in the lengthwise direction and are extended from these positions in the direction of the thickness of the supporting body 26. The same, at their probe base portions, are attached to the bottom face portion of the supporting body 26 by suitable attaching means 46 such as an electrically insulating adhesive agent. The second probes 30 are arranged in multiple layers (two layers in the case shown). The probe base portions 30a on the adjoining layers take different positions from each other in the vertical direction and the probe tip portion 30b and the probe tail portion 30c on these layers take different positions from each other in the direction of the thickness of the supporting body 26 (in the lengthwise direction of the opening 34).

The supporting bodies 26 are attached to the base plate 22 such that the bottom face portions of the supporting bodies 26 are extended in the widthwise direction of the opening 34, while having the probe tips of the probe groups spaced apart in the lengthwise direction of the opening 34, and such that the same are disposed at the same pitch as the pitch of the array of the integrated circuits to be tested at a time. The cables 32 are provided for each of the probe groups of the second probes 30.

Figure 5:
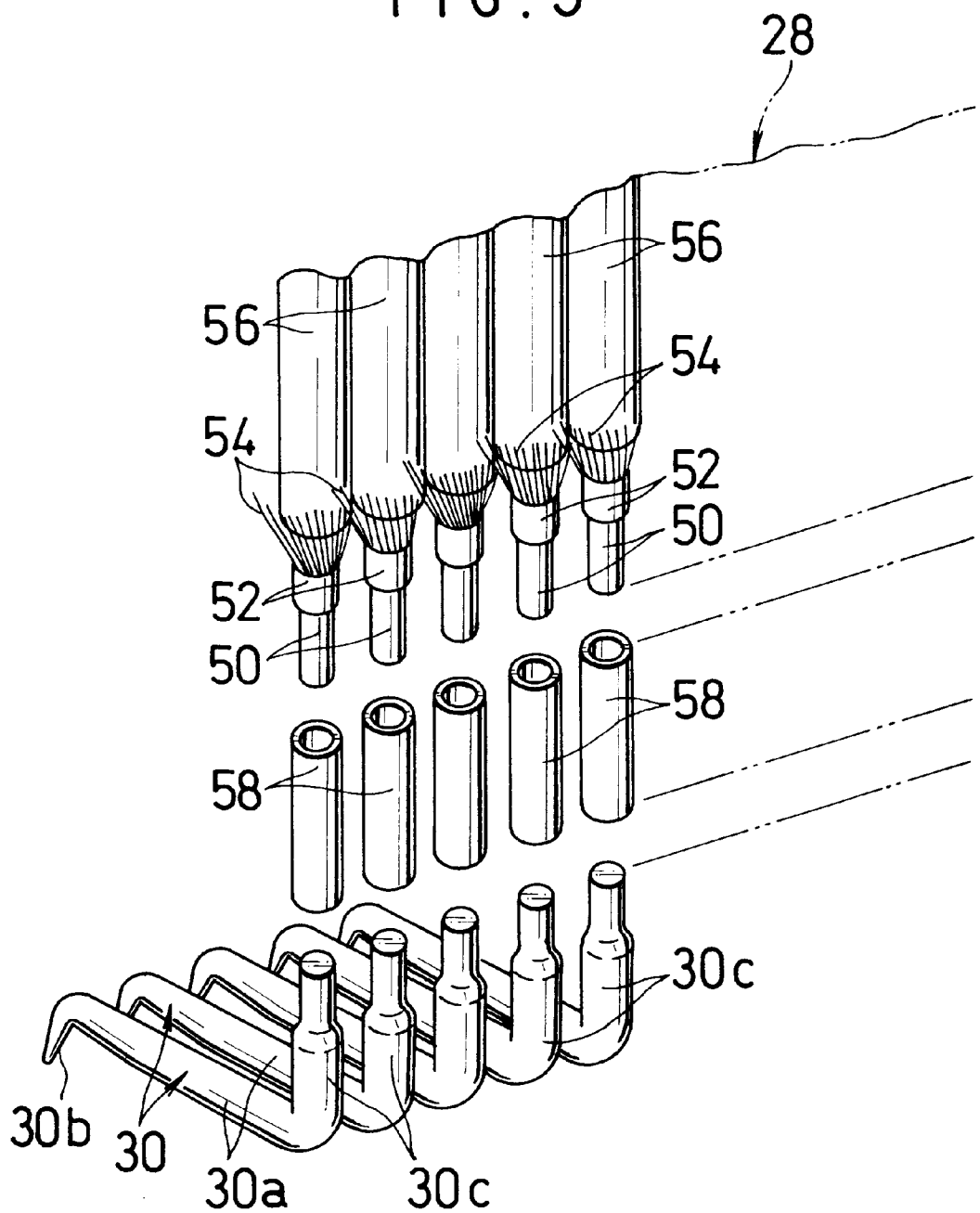
FIG. 5 is an enlarged and exploded perspective view for illustrating the state of connections between the second probes and cables.

As shown in FIG. 4 and FIG. 5, each cable 32 forms a coaxial flat cable by comprising a plurality of first conductor portions 50 extended parallel to each other, first insulator layers 52 covering the periphery of the respective first conductor portions 50, second conductor layers 54 covering the periphery of the respective first insulator layers 52, and second insulator layers 56 covering the second conductor members so as to integrally couple the second conductor portions 54 together.

The first conductor portion 50 is formed of a wire material with a circular cross section made of an electrically conducting material such as copper. The second conductor portion 54 is made of an electrically conducting material thinner than the wire material of the first conductor portion 50 and in a form of a mesh-like sack. The first and second insulator layers 52 and 56 are made of an electrically insulating resin such as polyimide.

Each first conductor portion 50 is attached, at one end portion thereof, to a terminal portion of a connector 58 (refer to FIG. 3), which is fitted in the connector 40 (refer to FIG. 1), whereby the same is electrically connected to the terminal portion and, at the other end portion, is fitted in a connection member 58. The second conductor portion 54 is electrically connected to the conductor layer 44 on the supporting body 26.

Each of the connection members 58 is made of an electric conductor material such as copper and formed in a shape of a cylindrical collar and has its other end fitted on the small-diameter base end of the second probe 30. Each connection member 58 can be electrically connected to the first conductor portion 50 and the second probe 30 by, for example, having its one end portion previously fitted on the first conductor portion 50 and then attached thereto by caulking and having its other end portion fitted on the second probe 30 and attached thereto by soldering, before or after the second probe 30 is attached to the supporting body 26.

The test head 20 can be fabricated by attaching the supporting body 26 to the base plate 22 after separately having the first probes 28 attached to the probe holder 24, i.e., to the base plate 22, and the second probes 30 attached to the supporting body 26. Therefore, the head can be fabricated easily.

The test head 20 is set in an inspection apparatus such that the probe tips of the first and second probes 28 and 30 are placed on the side of the integrated circuits 12 to be tested and the lengthwise direction of the opening 34 is aligned with the array of a plurality of integrated circuits 12 to be tested at a time. To achieve this, the test head 20 is set into an inspection apparatus, depending on the kind of the inspection apparatus into which the same is set, such that the probes 28 and 30 are oriented to be on any of the downward, upward, sideward, frontward, or rearward sides, and the base plate 22 is oriented to be in any of the horizontal, vertical, or oblique states.

At the time of inspection, the probe tips of the probes 28 and 30 are pressed against the pad 14 of the integrated circuits 12 slightly excessively by causing a relative movement between the test head 20 and the wafer 10.

Thereby, the first probes 28 attached to the base plate by the probe holder 24 are brought into contact with the pads 14 disposed at the portions corresponding to the edge portion defining the opening 34, and the second probes 30 attached to the base plate 22 by the supporting body 26 are brought into contact with the pads 14 existing at the boundary portions between the integrated circuits 12 to be tested at a time and disposed at the portions corresponding to the adjoining sides of the integrated circuits 12 in the array.

In other words, of the first probes 28, the first probes 28 disposed at the edge portions in the widthwise direction of the opening 34 are brought into contact with the pads 14 disposed at the portions corresponding to the edge portions in the widthwise direction of the opening 34 and the first probes 28 disposed at the edge portions in the lengthwise direction of the opening 34 are brought into contact with the pads 14 disposed at the portions corresponding to the edge portions in the lengthwise direction of the opening 34. Meanwhile, the second probes 30 are brought into contact with the pads placed at the portions corresponding to the intermediate positions in the lengthwise direction of the opening 34 and arranged in the widthwise direction of the opening 34.

When probes 28 and 30 are excessively pressed, they are curved in an arched manner by over-drive action. Thereby, a predetermined pressure is produced between the probe tips of the probes 28 and 30 and the pads 14 on the integrated circuits 12 and also a predetermined slide is produced between them. As a result, the oxide film formed on the pad 14 is scraped off and the probe tips of the probes 28 and 30 come to be electrically connected with the pads 14 on the integrated circuits 12.

Since the integrated circuits 12 to be tested at a time are successively disposed in the lengthwise direction of the opening 34, the first probes 28 may be divided into a plurality of groups in the lengthwise direction of the opening 34 and connected to each group of the wiring groups on the base plate 22. Since the second probes 30 are arranged in multiple layers, the same for each layer can be connected to the first conductor portions 50 of the same cable 32. Therefore, according to this test head 20, wiring work is facilitated and there is no fear of making incorrect wiring.

The first probes 28 may be arranged in multiple layers. Further, the second probes 30 may be arranged in a single layer or the second probes 30 may be arranged such that the probe base portions 30a and the probe tip portions 30b of the same are in a single-layer arrangement and the probe tail portions 30c are in a multilayer arrangement in the lengthwise direction of the opening 34. Further, the second probes 30 may be arranged such that the probe base portions 30a, the probe tip portions 30b, and the probe tail portions 30c are different in number of their layers from one another. In such a case, it is preferred that the second probes 30 be arranged such that the number of layers of the probe tail portions 30c is greater than that of the probe base portions 30a and that of the probe tip portions 30b.

Figure 6:
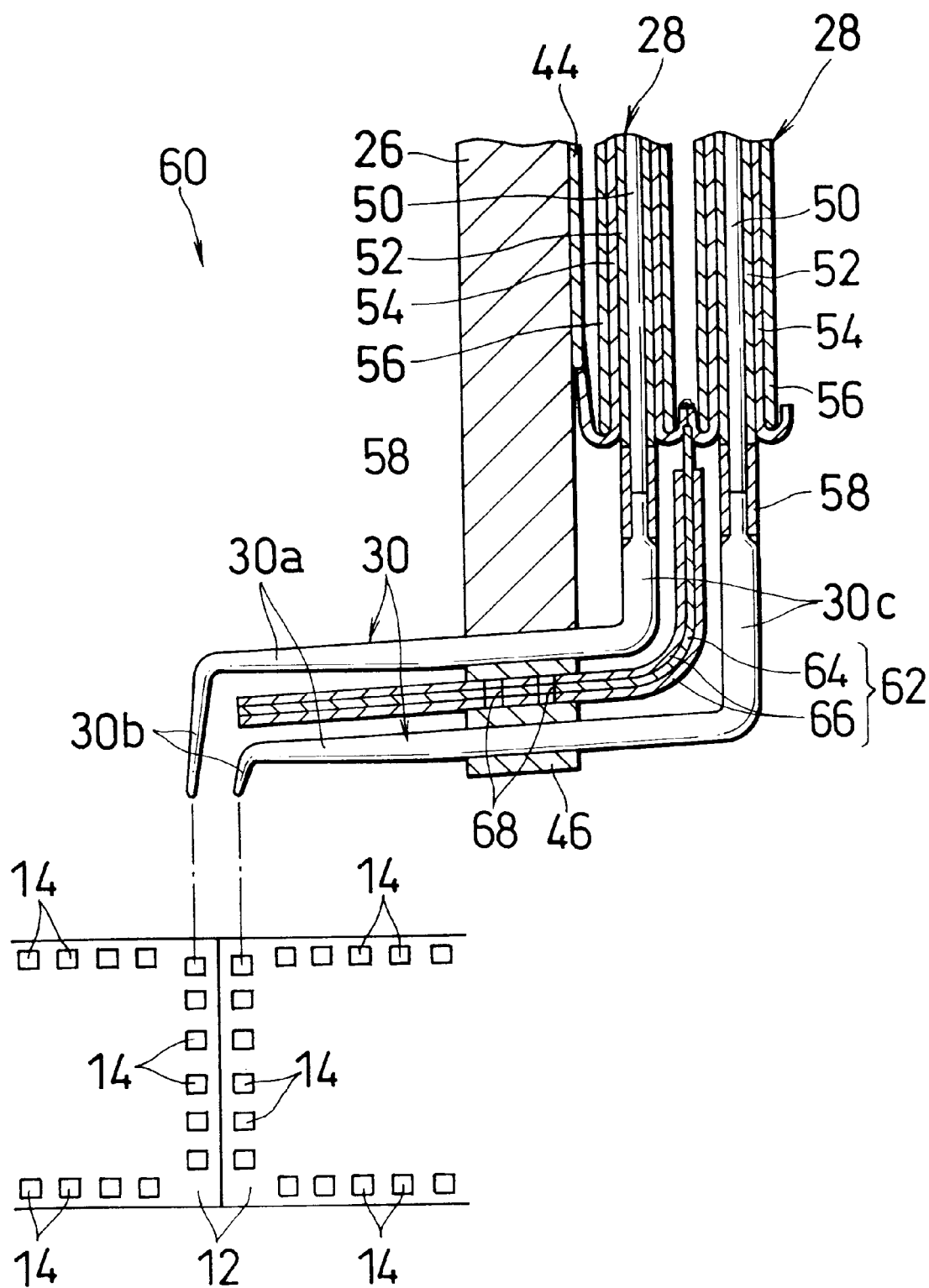
FIG. 6 is an enlarged sectional view similar to FIG. 4(A) showing another embodiment of the test head of the invention.

The test head 60 shown in FIG. 6 further includes a sheet-like member 62 disposed between adjoining groups of the groups of the second probes 30 arranged on the supporting body 26. The sheet-like member 62 has a laminated structure with a conductor layer 64 of such an electrically conducting material as a metallic foil sandwiched between two electric insulator layers 66 of such an electrically insulating material as polyimide, and the same is extended between the probe base portions 30a and the probe tail portions 30c of the second probes 30.

The sheet-like member 62 has a plurality of holes 68 passing through the sheet-like member 62 in the direction of the thickness at the underside portion of the supporting body 26 and stuck by an adhesive agent 46 to the underside of the supporting body 26 together with the second probes 30. The adhesive agent 46 passes through each hole 68. Accordingly, the sheet-like member 62 are solidly stuck to the supporting body 26 together with the second probes 30 disposed under the same.

The conductor layer 64 is electrically connected with the second conductor portion 54 of the cable 28. The conductor layer 64 is grounded through the second conductor portion 54 of the cable 28 and the conductor layer 44 of the supporting body 26. Accordingly, signal leakage between the vertically adjoining second probes 30 can be prevented by the sheet-like member 62.

While only one sheet-like member is used in the example of the test head 60 shown in FIG. 6 because the second probes 30 are in a two-layer arrangement, two sheet-like members are used when the second probes 30 are arranged in three layers or more.

The invention is not limited to the above described embodiment. For example, instead of using one probe holder, the probe holder may be divided into a plurality of probe holding members depending on the pattern of an array of the pads on the integrated circuits, and the probe holding members may be attached to a common attaching frame by suitable attaching means such as screw members. Further, the probe may have another cross section than the above described circular form, e.g., a square cross section.

What is claimed is:

1. A test head for use in an electrical characteristic test of a plurality of integrated circuits formed on a semiconductor wafer, comprising:

a base plate having a rectangular opening formed in its center;

a probe holder having a first probe-supporting portion extending along each of the lengthwise and widthwise edge portions of the opening, the probe holder being attached to the base plate;

one or more plate-like supporting bodies having a second probe-supporting portion extending in the widthwise direction of the opening, each second probe-supporting portion extending to cross the lengthwise direction of the opening;

a plurality of first probes disposed at the first probe-supporting portion; and a plurality of second probes disposed at the second probe-supporting portion;

wherein each supporting body is attached to the base plate with the direction of its thickness oriented in the lengthwise direction of the opening;

wherein the first probes disposed at the edge portions in the lengthwise direction of the opening project from the respective edge portions in the widthwise direction of the opening;

wherein the first probes disposed at the edge portions in the widthwise direction of the opening project from the respective edge portions in the lengthwise direction of the opening; and wherein the second probes project from the second probe-supporting portion in the lengthwise direction of the opening.

2. A test head according to claim 1, wherein the second probes disposed at each second probe-supporting portion are divided into a plurality of probe groups, and probe tip portions of the second probes are offset from one probe group to another in the lengthwise direction of the opening.

3. A test head according to claim 1, wherein each second probe has a probe base portion held by the second probe-supporting portion, each probe tip portion extending in the direction of the side opposite the base plate from the front end of the probe base portion, and each probe tail portion extending in the direction opposite the probe tip portion from the rear end of the probe base portion.

4. A test head according to claim 1, further comprising wiring means having one or more flexible and belt-like cables for the second probes and a plurality of conductive and cylindrical connection members, wherein the cable includes a plurality of first conductor portions extended parallel to each other, first insulator layers covering the periphery of the respective first conductor portions, second conductor portions covering the periphery of the respective first insulator layers, and a second insulator layer covering the second conductor members so as to integrally couple the second conductor members together, and wherein the connection member has its one end portion fitted on the probe tail portion of the second probe and its other end portion fitted on the first conductor portion.

5. A test head according to claim 1, wherein the second probes are disposed in multiple layers and the layers are connected to their respective wiring means, each wiring means includes one or more flexible belt-like cables and a plurality of conductive and cylindrical connection members, each cable includes a plurality of first conductor portions extended parallel to each other, first insulator layers covering the periphery of the respective first conductor portions, second conductor portions covering the periphery of the respective first insulator layers, and a second insulator layer covering the second conductor members so as to integrally couple the second conductor members together, and each connection member has its one end portion fitted on the probe tail portion of the second probe and its other end portion fitted on the first conductor portion.

6. A test head according to claim 5, further comprising one or more sheet-like members disposed between adjoining probe groups and connected to the second conductor portion.

* * * * *